United States Patent [19]

Tanner

[11] Patent Number: 4,882,733
[45] Date of Patent: Nov. 21, 1989

[54] METHOD AND APPARATUS FOR COMBINING ENCODING AND MODULATION

[75] Inventor: Robert M. Tanner, Capitola, Calif.
[73] Assignee: Ford Aerospace Corporation, Detroit, Mich.
[21] Appl. No.: 25,768
[22] Filed: Mar. 13, 1987
[51] Int. Cl.$^4$ .............................................. G06F 11/10
[52] U.S. Cl. ....................................... 371/43; 371/37.1
[58] Field of Search .................. 371/37, 38, 39, 40, 371/43, 44, 45; 375/42, 58, 67, 25, 27, 34, 37, 38; 332/9 R, 10

[56] References Cited

U.S. PATENT DOCUMENTS

| | | | |
|---|---|---|---|
| 4,077,021 | 2/1978 | Csajka | 371/43 X |
| 4,211,996 | 7/1980 | Nakamura | 371/37 |
| 4,295,218 | 10/1981 | Tanner | 371/40 |
| 4,547,882 | 10/1985 | Tanner | 371/38 |
| 4,553,237 | 11/1985 | Nakamura | 371/37 |
| 4,597,090 | 6/1986 | Forney | 371/37 X |
| 4,700,349 | 10/1987 | Gallager | 371/43 X |

OTHER PUBLICATIONS

Sayegh, Soheil I., "A Class of Optimum Block Codes in Signal Space," IEEE Transactions on Communications, vol. COM 34, No. 10, Oct. 1986, pp. 1043-1049.
Ungerboeck, Gottfried, "Channel Coding with Multilevel/Phase Signals", IEEE Transactions on Information Theory, vol. IT-28, No. 1/ Jan. 1982, pp. 55-67.
Imai, Hideki & Shuji Hirakawa, "A New Multilevel Coding Method Using Error-Correcting Codes," IEEE Transactions on Information Theory, vol. IT-23, No. 3, 1977, pp. 371-377.
Tanner, R. Michael, "A Recursive Approach to Low Complexity Codes", IEEE Transactions on Information Theory, vol. IT-27, No. 5, Sep. 1981, pp. 533-547.
Chethik, Frank; Gallagher & Hoeber, "Waveform and Architecture Concepts for a High Efficiency TDMA Statcom System", 11th Annual Communications Satellite Systems Conference, San Diego, Calif., Mar. 16-20, 1986.
Monte, P. A., C. F. Hoeber & Dr. R. Michael Tanner, "Bandwidth and Power Efficient Modulation and Coding Developments," International Symposium of Space Technology of Science, Tokyo, May 18-23, paper presented May 22, 1986.
Ginzburg, V. V., "Multidimensional Signals for a Continuous Channel, Problemy Peredachi Informatsii", vol. 20, No. 1, 1984, pp. 28-46.

Primary Examiner—Jerry Smith
Assistant Examiner—Robert W. Beausoliel
Attorney, Agent, or Firm—Kenneth R. Allen; Edward J. Radlo; Keith L. Zerschling

[57] ABSTRACT

A method and apparatus for combining encoding and modulation creates signal sets from available amplitude and phase modulations by indexing ordered subspaces. The subspaces need not be limited to the class of subspaces known as binary subspaces. The resultant signal sets, for a preselected power and bandwidth, are widely separated and unlikely to be confused by the effects of channel noise. Such signals can be in either finite block or convolutional form, depending on the natural format of the desired transmission. Further according to the invention are basic apparatus for encoding and modulating as well as demodulating and decoding a signal in accordance with the invention. Specifically, a method is provided for decoding the incorporates a specific type of decoding/demodulation techniques which develops accurate estimates of the information from the received signal in a computationally efficient manner and which permits high speed operation using softdecision decoders.

20 Claims, 5 Drawing Sheets

METHOD AND APPARATUS FOR COMBINING ENCODING AND MODULATION

BACKGROUND OF THE INVENTION

This invention relates to digital communications and more specifically to techniques for constructing bandwidth efficient signal sets by combining error correcting encoding with modulation of digital data. More specifically, the invention relates to generalized methods and apparatus for encoding and modulating digital information signals and methods and apparatus for demodulating and decoding signals from an information channel containing information. The invention finds particular application to time-division multiple-access (TDMA) operation in a frequency-division multiple-access environment, such as a satellite transponder channel.

In order to aid in identifying the relevance of the references cited herein, the references cited herein are referred to frequently by the abbreviations following the citations listed hereinbelow.

In electronic data communication systems, random noise or interference can cause the transmitted signal to be contaminated and lead to errors in the received message. In systems where the reliability of received data is very important, error-correcting codes have been used to protect the transmitted message and enable system designers to reduce the effects of noise. Two major schools of thought and associated bodies of theory have emerged for performing this task: algebraic block coding, which relies heavily on the use of modern algebra and typically constructs codes as linear subspaces of a fixed size vector space over a finite field: and convolutional coding, in which the transmission is viewed as being continuous and the design typically relies more on computer search techniques and close analysis of the state diagram of the possible convolutional encoder circuits.

For many years, the coding process was effectively separated from the problem of modulation in conventional systems. Modulation is the creation of, for example, electromagnetic signals in which changes in phase, frequency, or amplitude are used to distinguish different messages.

Figure 1:
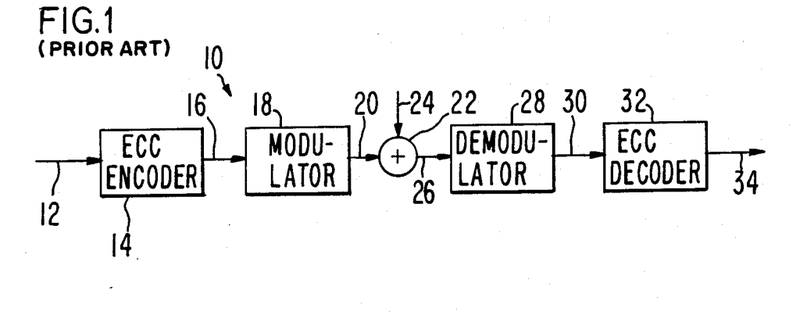
FIG. 1 is a block diagram of a first prior art error correcting code-based communication system.

Referring to FIG. 1 representing a prior art system 10, in conventional systems 10 a block or stream of information digits 12 is fed into a digital encoder 14 designed for a specific error-correcting code where redundant check bits are added. The resultant encoded digits 16 are then fed into a modulator 18 where each digit or set of digits is typically mapped to a modulated symbol to be transmitted as information in for example a radio frequency signal 20. The radio frequency signal 20 is applied to a channel 22 wherein noise and interference 24 are added and then received as a signal with errors 26 at a demodulator 28. The demodulator 28 attempts to extract from the signal with errors 26 redundant digits with errors 30 which are fed to an error correcting decoder 32 designed to accommodate the error correcting code. The decoder 28 then uses known redundancy structure of in the encoded digits 16 to eliminate as many errors as possible producing as its output estimated received digits 34. In some systems, the demodulator 28 also provides "soft decision information" or "reliability" information along with the estimate of the received digits which can be used effectively in a variety of error-correcting decoders to improve performance, particularly Viterbi decoders for convolutional codes.

To maintain the separations between different messages guaranteed by the minimum Hamming distance of the error-correcting code, the mapping performed by the demodulator 28 must be chosen with care. (The Hamming distance between two words is the number of digits in which the two words differ. The minimum Hamming distance of a code is the minimum over all pairs of code words in the code of the Hamming distance between the two code words.) For example, in binary systems using phase-shift modulations, the correspondence between the redundant binary sequences and the particular phase of a transmitted signal is often dictated by a Gray code.

The use of error-correcting coding in this manner frequently is an alternative to increasing the power of the transmitted signal to overcome the noise. Conversely, the use of coding permits the power of the transmission to be reduced with no degradation in the reliability of the transmission. The power savings obtained in this way are measured in terms of the allowable reduction in decibels of power-per-bit for the same bit error rate, a quantity referred to as "coding gain." However, since coding requires the addition of redundant digits, for a fixed modulation scheme the use of coding requires that symbols be sent at a faster rate, thereby increasing the frequency bandwidth occupied by the transmission.

As the demand for communication links has increased, there has been growing competition for the available electromagnetic spectrum, and significant expansion of the bandwidth of the signal to reduce the power required has no longer been acceptable in many instances. Thus attention has turned to methods of combining coding and modulation into one coordinated mapping to achieve signals that are efficient in both power and bandwidth utilization. In the past, efforts have followed the two pathways set by error-correcting coding theory, with some building on the concepts of convolutional codes whereas others start from the block code ideas.

Figure 2:
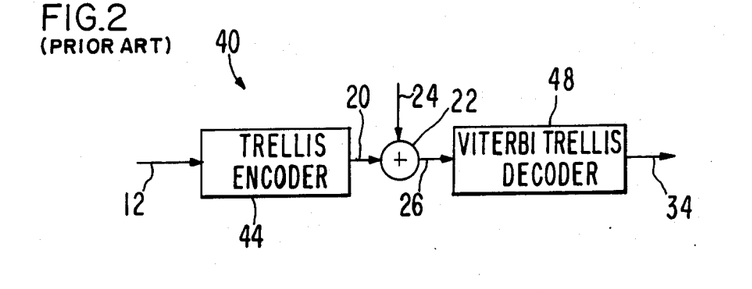
FIG. 2 is a block diagram of a second prior art error correcting code-based communication system.

In the convolutional school, a major step forward was made by Ungerboeck as described in his paper "Channel Coding with Multilevel/Phase Signals" [ung], in which he pointed out that the Euclidean distance properties of the electromagnetic signal space could be incorporated into the design of a convolutional code encoder. FIG. 2 illustrates the basic structure for comparison with FIG. 1. Using the trellis characterization of the encoder, i.e., a trellis encoder 44, information digits 12 are mapped directly to modulated signals 20 so as to add redundancy only when the electromagnetic symbols are likely to be confused. The error-correcting encoder and modulator are combined into a single coder/modulator herein called the trellis encoder 44. The standard Viterbi algorithm for decoding convolutional codes can be readily adapted to a so-called Viterbi trellis decoder 48 to decode the received symbols (signal with errors 26) directly to estimated information digits 34. In adapting the convolutional coding methodology, Ungerboeck chose not to "pursue the block coding aspect because the richer structure and omission of block boundaries together with the availability of Viterbi ML-decoding algorithm [sic] make trellis codes appear to us more attractive for the present coding problem [ung,p.58]."

Others have followed Ungerboeck. For example, recently S. G. Wilson has shown a construction for rate 5/6 trellis codes for an 8-state phase-shift keying (8-PSK) system and has found that it achieves an asymptotic gain of 6.2 dB over an uncoded 8-PSK system [wlsn].

Other researchers have pursued the construction of efficient coding/modulation systems from the algebraic block code point of view. Imai and Hirakawa showed how error-correcting codes of increasing strengths can be coupled to increasingly error-sensitive parameters of the signal modulation in both multilevel and multiphase modulations to give improved performance. Furthermore they explained a staged decoding method in which the most sensitive parameters are estimated first, using the a posteriori probabilities based on the channel statistics and the code structure wherein those estimates are used in later probability calculations to determine estimates for the successively less sensitive parameters [i&h].

Similarly, V. V. Ginzburg has used algebraic techniques to design multilevel multiphase signals for a continuous channel. His methods address the case where the measure of distance in the continuous channel is monotonically related to an additive function of the distances between individual signal components. (Such additivity is commonly assumed in satellite channel models, for example.) He generalized the ideas of Imai and Hirakawa by partitioning the set of elementary modulation signals into carefully chosen subsets that permit the actual channel distance between signals to be associated with the particular subsets in which the signals are found. He then combined a hierarchy of subsets with a matching hierarchy of codes of increasing strength to design signal sets that are guaranteed to have large separations in the signal space. The algorithms he suggested for demodulating and decoding the signals has been given in only abstract mathematical terms: "A rigorous maximum-likelihood demodulation procedure of acceptable complexity may be built only in exceptional cases. A most simple approximate procedure implementing an energy distance D (i.e., one that leads to a correct decision for a noise energy $<D/4$) may be built as a sequence of integral reception procedures (to be carried out in the order of decreasing levels) for the individual codes that define the signal-system construction, if each of them implements D . . . " [gnz].

Most recently, Sayegh [syh] has developed further the methods of Imai and Hirakawa by explicitly defining particular block codes that can be attached to the various levels of a hierarchy which admits to soft-decision decoding procedures, and he has demonstrated some achievable gains using his methods through simulation studies for very short codes. Sayegh's work is notable as well in that he has shown how Imai and Hirakawa's method can be combined with the signal set partitions of Ungerboeck to create combined coding and modulation systems based on several other signal constellations. Sayegh's work represents what is believed to be the most relevant development to the present invention. However, Sayegh does not represent a prior art publication, since publication was less than one year prior to the filing date of the present application.

Other authors [ck&sl] [frny86] have approached the problem of constructing bandwidth efficient signal sets using mathematically defined lattices. Thus, their work is distinguishable as essentially unrelated to the present scheme.

DEFICIENCIES IN THE PRIOR ART

To understand the key advances of the present invention, it is important to understand the deficiency of the conventional practice of decomposing the process of creating the radio wave signal into separate processes of error-correcting encoding followed by modulation with, for example in the case of PSK, a Gray code: how the more recent methods ([i&h], [ung] and [gnz]) create a more effective linkage between the code structure and the demodulator and thus improve the quality of the constructed signal set; and how the new methods of the present invention present significant advantages in the effectiveness of the linkage both for creating high quality signal sets and facilitating computation of the estimation of the transmitted information by the receiver.

The preponderance of the literature and theory on the construction of error-correcting codes addresses the problem of creating linear codes (e.g., [v&o, pp. 82–101]), which are well suited for protecting messages to be sent across a symmetric channel. For the symmetric channel, a central index of the quality of a code is its minimum Hamming distance, the minimum number of digits in which any two distinct code words must differ. The mathematical theory of codes such as BCH codes, which are output from an encoder to a modulator, attempts to guarantee that the minimum Hamming distance of the code in the (digital) vector space of the communication channel is as large as possible for a given code rate and block length, since the larger the minimum distance, the more errors that are certain to be correctable by a maximum likelihood decoding algorithm.

However, on the continuous white Gaussian channel, most modulation schemes do not induce a symmetric channel from the perspective of the digital error-correcting coding system. Certain pairs of elementary modulations are closer in the Euclidean space of the channel than are others, and thus they are more likely to be confused than others. At very high signal-to-noise ratios, the probability of error for a maximum likelihood decoder is directly related to the minimum Euclidean distance separating any pair of distinct transmitted signals. Thus, for an entire coding/modulation system, an important measure is the minimum Euclidean distance.

Figure 3:
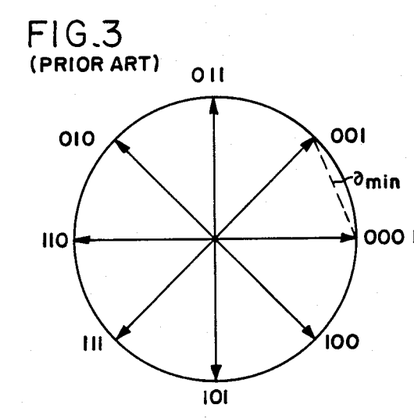
FIG. 3 is a phase diagram (modulation constellation diagram) illustrating a Gray code indexing of phase states for 8 PSK modulation.

To illustrate by reference to FIG. 3, in the case of phase-shift modulations such as 8-PSK in conventional systems, the use of a Gray code mapping of binary triples to phase states serves the purpose of assuring that the Hamming distance of the error-correcting code is reflected in a reasonable lower bound on the Euclidean distance. In FIG. 3 for a specific example, since by definition of a Gray code, the Gray code binary sequences associated with any pair of adjacent modulations differ in exactly one bit, the minimum squared Euclidean distance of a pair of signals in a two-dimensional signal subspace formed by a binary error-correcting code of minimum Hamming distance D and Gray coding must be at least D $\delta^2$, where $\delta^2$ is the minimum squared Euclidean distance between modulation phases.

This scheme is deficient because it creates a potential ambiguity due to the simultaneous occurrence of minimums. Specifically, the minimum Hamming distance separation in binary sequences can be achieved simultaneously with the minimum squared Euclidean distance of the modulation, thus creating a signal set for which a pair of signals is separated by a squared Euclidean distance that is the product of minimums, $D \delta^2$, which is the undesirable ambiguity.

Both Ungerboeck and Ginzburg avoid the possibility of the simultaneous occurrence of minimums by coupling the coding to the modulation via a careful nested partitioning of the available modulations into subsets. In Ungerboeck's language, the mapping of binary sequences to modulations "follows from successive partitioning of a channel-signal set into subsets with increasing minimum distances:

$$\Delta_0 < \Delta_2 < \Delta_2$$

between the signals of these subsets." Ungerboeck then attaches modulations of particular subsets directly to edges in a trellis encoder for a convolutional code in such a way that the constraints of the trellis prevent the smallest Euclidean distances from occurring on all of the edges of the short paths originating and terminating at the zero state of the trellis. Effectively, this prevents a simultaneous occurrence of minimums in both the redundancy imposed by the trellis and the Euclidean separation of the modulations.

Similarly, Ginzburg, in his hierarchical construction, defines partitions with L levels and associated minimum squared Euclidean distances satisfying:

$$\delta_L^2 < \ldots < \delta_2^2 < \delta_1^2$$

(adapting Ginzburg's language to the present notation). He then associates a different error-correcting code with each level, the code for the $l^{th}$ level having a minimum distance $D_l$. (Note the difference between the variable 1 and the numeral 1 herein.) The squared Euclidean distance for the signals thus created must be at least:

$$D \leq \min_{1 \leq l \leq L} (\delta_l^2 D_l).$$

Since the $D_l$ values are chosen to be larger for the $\delta_l$ that are smaller, this minimum is much greater than the product of the minima. Likewise, the earlier technique of Imai and Hirakawa may be viewed as a special instance of Ginzburg's signal construction method.

In Ginzburg's method, the use of freely created nested partitions creates some limitations. At the $l^{th}$ level, there are actually a very large number of partitions, a different partition for each of the subsets created in the partition at the $(1-1)^{st}$ partition. Due to the process of successive subdivision the number of subsets of modulations that must be considered grows exponentially with the level, and the $\delta_l$ associated with the $l^{th}$ level is actually a minimum overall of the subpartitions at the $l^{th}$ level.

With regard to prior art decoding circuitry and methods as hereinafter discussed, all of the workers in the field previously cited have recognized the difficulty of decoding these high performance coding modulation schemes. Typically systems in which combined coding and modulation is contemplated are those where soft decision information is available. The most commonly used algorithm is the Viterbi algorithm, which can incorporate soft decision information into the calculation of path metrics. The path metrics are used to determine the best estimate of each of the transmitted bits.

There is nothing in principle that precludes the use of the Viterbi algorithm in cooperation with encoding/modulation systems with encoders according to the invention as described herein. If all such encoders are convolutional, the encoder can take the form of a trellis encoder and the resultant signal can be decoded using the techniques suggested by Ungerboeck for trellis codes. In practice, however, the powerful codes created by the encoders of the invention as described herein can create redundancies which interrelate a large number of transmitted symbols and, when viewed as trellis codes, have an extremely large number of states. The number of states will in most instances make the Viterbi algorithm impractical.

For the encoder/modulators based on block codes, the same problem is encountered. Most techniques for decoding block codes using soft decision information are very complex. For example, the Chase algorithm [ch] can be employed when the expected number of errors is very small, but the computational effort required grows exponentially when the number of errors to be corrected increases. Similarly, it is possible to contemplate the use of Forney's generalized minimum distance decoding [frny66], but the complexity of this technique in practice is usually prohibitive.

What is needed therefore is very efficient low-complexity algorithms. The present inventor as described in Tanner [tan81] has described algorithms which as described hereinbelow have potential interest in decoding/demodulation methods and apparatus according to the invention. The Tanner article is therefor incorporated herein by reference and made a part hereof. Tanner's algorithms lead to a wide variety of decoder architectures, many of which are particularly well suited to parallel implementation in large scale integrated circuits. While the algorithms described in the Tanner article (e.g., Algorithm B) do not perform maximum likelihood decoding, they can be used effectively to decode much longer codes than can other methods, either large length block codes or large constraint length convolutional codes, without incurring prohibitive circuit complexity costs. Moreover, the suboptimal Algorithm B, for example, can incorporate soft decision information into the decoding process for either block or convolutional codes with very little increase in the complexity of the decoding algorithm. In practice, decoding systems based on Tanner algorithms can outperform many Viterbi algorithm-based systems because the sub-optimality of the decoder performance is minor compared to the advantage of using a more powerful coding/modulation design.

In most advanced modulation systems, the demodulator receives a single symbol that can be viewed as a vector in some symbol vector space. It then computes a distance measure for the separation between the received symbol and all of the possible elementary modulations. In so-called "hard decision" demodulators, the distance measure is heavily quantized to two implicit values. The closest elementary modulation is emitted as the best estimate (implicitly at distance O) and the others are viewed as being at distance 1. In "soft decision" demodulators, the demodulator can put out numbers, typically viewed as quantized representations of real numbers, that indicate the likelihood that the received vector came from each of the possible elementary modulations.

Making optimal use of this "soft decision" information as well as the constraints imposed by the digital code structure is in general very difficult. While it is possible to contemplate the design of a decoder based on Tanner's algorithms that would use all of the probability information provided by the channel for a sophisticated modulation scheme, heretofore nothing has been taught or suggested which could optimize the process in a simple fashion.

Imai and Hirakawa proposed a technique for pure 2M-ary PSK and pure multilevel signaling wherein the most sensitive or least significant bit of the modulation are decoded using calculated probabilities [i&h, p. 373]. The estimates for these least significant bits are then fed into a decoder for the L-th error-correcting code, generally the most powerful code. The final decision bits from this $L^{th}$ decoder are then used in combination with the channel soft-decision information in providing the probability estimates needed for the $(L-1)^{st}$ decoder. The final decision bits from the $(L-1)^{st}$ stage along with the final decisions from the $L^{th}$ stage are in turn used in providing the probability estimates needed for the $(L-2)^{nd}$ decoder, and so forth, until the most significant bits are decoded.

While the description is very incomplete, Sayegh's decoding procedures [syh, p. 1044] appear to be those of Imai and Hirakawa adapted to the additional modulations he treats, requiring an optimal decision at each stage of a sub-optimal procedure. This decomposition adds a further source of potential loss. If the decoder at some stage does not provide the correct final decision bits, the estimates used in calculating probabilities for all successive stages will reflect the errors and increase the possibility of decoding error in those later stages. However for high-speed systems the decomposition has the advantage of creating parallel data paths for the decoding of the bits of different significance. In the representative circuit shown in FIG. 2 of Imai and Hirakawa, there are four different decoders for different error-correcting codes all working simultaneously in pipelined fashion. As a result, each of the decoders must handle data at only a fraction of the raw input rate. In high performance systems, very efficient error-correcting codes must create dependencies that interrelate large numbers of digits, requiring either a long block length in the case of algebraic block codes or a long constraint length in the case of convolutional codes. As is well known to those acquainted with the coding arts, decoding such codes using soft decision information is very complex. Typical implementations for such decoders either cannot handle high data rates or require large and complex circuits that consume significant power. What is needed is a more efficient decoding scheme.

CITATION OF PRIOR ART REFERENCES

The following references are considered relevant to the present disclosure and/or provide background for an understanding of the relevance of the present invention:

E. Berlekamp, Algebraic Coding Theory. New York: McGraw-Hill, 1968. [brl]

R. E. Blahut, Theory and Practice of Error Control Codes. Reading, MA: Addison-Wesley, 1983. [blht]

D. Chase, "A class of algorithms for decoding block codes with channel measurement information," IEEE Trans. Inform. Theory, vol. IT-IX, January 1972,pp. 170–182. [ch]

G. D. Forney, Concatenated Codes. Cambridge, MA: MIT Press, 1966. [frny66]

V. V. Ginzburg, "Multidimensional signals for a continuous channel," Problemy peredachi informatsii [Problems of information transmission], Vol. 20, No. 1, 1984, pp. 28–46 [translated from the Russian by the Politecnico di Torino]. [gnz]

W. C. Gore, "Further results on product codes," IEEE Trans. Inform. Theory, vol. IT-16, July 1970, pp. 446–451. [gore]

H. Imai and S. Hirakawa, "A new multilevel coding method using error-correcting codes," IEEE Trans. Inform. Theory, vol. IT-23 No. 3, pp. 371–377, 1977. [i&h]

S. Lin and D. J. Costello, Jr., Error Control Coding: Fundamentals and Applications. Englewood Cliffs, N.J.: Prentice-Hall, 1983. [l&c]

F. J. MacWilliams and N. J. A. Sloane, The Theory of Error-Correcting Codes. New York: North-Holland, 1977. [mc&sl]

W. W. Peterson and E. J. Weldon, Jr., Error-Correcting Codes. Cambridge, MA: MIT Press, 1972. [p&w]

R. M. Tanner, "A recursive approach to low complexity codes," IEEE Trans. Inform. Theory, vol. IT-27, No. 5, Sept. 1981, pp. 533–547. [tan81]

ERROR-CORRECTING CODING SYSTEM, U.S. Pat. No. 4,295,218, issued October 1981 to R. M. Tanner, assigned to the Regents of the University of California. [tanCP]

G. Ungerboeck, "Channel coding with multi-level/phase signals," IEEE Trans. Inform. Theory, vol. IT-28, No. 1, Jan. 1982, pp. 55–67. [ung]

A. J. Viterbi and J. K. Omura, Principles of Digital Communication and Coding. New York: McGraw-Hill, 1979. [v&o]

J. M. Wozencraft and I. M. Jacobs, Principles of Communication Engineering. New York: Wiley, 1965. pp. 1045–1049. [wz&j]

BACKGROUND REFERENCES

The following publications, believed not to be prior art because of dates of publication, art cited to provide background for the subject matter of the present invention:

R. Calderbank and N. J. A. Sloane, "New Trellis codes," presented at the IEEE International Symposium on Inform. Theory, Ann Arbor, Mich., October, 1986. [ck&sl]

G. D. Forney, "Coset Codes II: Binary Lattices and Related Codes," presented at the IEEE International Symposium on Inform. Theory, Ann Arbor, Mich. Oct. 1986. [frny86]

S. I. Sayegh, "A class of optimum block codes in signal space," IEEE Trans. Commun., vol. COM-34, No. 10, Oct. 1986, pp. 1043–1045. [syh]

S. G. Wilson, "Rate 5/6 trellis-coded 8 PSK," IEEE Trans. Commun., vol. COM-34, No. 10, October, 1986 pp. 1045–1049. [wlsn]

INCORPORATION BY REFERENCE

The following publication, which is not a prior art reference, is based in part on the work disclosed herein and is therefore incorporated herein by reference:

F. Chethik, V.(K.) Gallagher and C. Hoeber, "Waveform and Architecture Concepts for a High Efficiency TDMA Satcom System," presented at the Eleventh AIAA Communications Satellite Systems Symposium, Mar. 16, 1986, in San Diego, Calif. (9 pages).

SUMMARY OF THE INVENTION

According to the invention, method and apparatus provide combined encoding and modulation which creates signal sets from available amplitude and phase modulations by indexing into ordered subspaces. The ordered subspaces need not be limited to the class of subspaces known as binary subspaces. The resultant signal sets, for a preselected power and bandwidth, are widely separated and unlikely to be confused by the effects of channel noise. Such signals can be in either finite block or convolutional form, depending on the natural format of the desired transmission. Further according to the invention are basic apparatus for encoding and modulating as well as apparatus for demodulating and decoding a signal in accordance with a demodulation/decoding method of the invention. Specifically, a demodulation/decoding method is provided for incorporating a known decoding technique that develops accurate estimates of the information from the received signal in a computationally efficient manner and that permits high speed operation using soft-decision decoders.

The invention will be better understood by reference to the following detailed description in conjunction with the accompanying drawings.

DETAILED DESCRIPTION OF THE INVENTION

According to the present invention, a method is provided for making the minimum Euclidean distance in the Euclidean space of a communication channel as large as possible, or, equivalently and more conveniently, to make the squared Euclidean distance as large as possible, rather than concentrating alone on the Hamming distance of the error-correcting code in the vector space of the digital channel. More specifically, modulations are indexed to form them into ordered subspaces, which include both binary and nonbinary subspaces. The subspaces provide more highly disciplined indexing that could otherwise be exploited without further detailed knowledge of the structure of the particular modulations.

Encoding and Modulation Methods and Circuits

To create the tightest linkage between the structure of the digital error-correcting code and the modulation, the digital indexing of the possible modulations is crucial. Algebraic error-correcting codes are in almost all instances based upon finite fields and can be organized into subspaces. These subspaces are themselves error-correcting codes of potentially different correcting abilities. The well-known BCH codes, for example, can be viewed as nested, with a larger minimum distance code with more numerous roots being a subcode of a code with fewer roots and smaller minimum distance. For instance, the words of the (15,1,15) BCH code are all words in the (15,5,7) code, which are in turn all words in the (15,11,3) code, which are in turn all words in the trivial (15,15,1) code. It has been shown by others that such nested subcode structure could be used to construct recursively long and powerful error-correcting codes based on simple codes that form nested subspaces.

According to the present invention, however, the method of constructing nested subcodes from error-correcting coding theory is adapted to the construction of combined coding and modulation systems. The available modulations are indexed by vectors over a finite field in such a way that the additive modulation distances are well organized by subspaces and affine (shifted) varieties of those subspaces.

Figure 4:
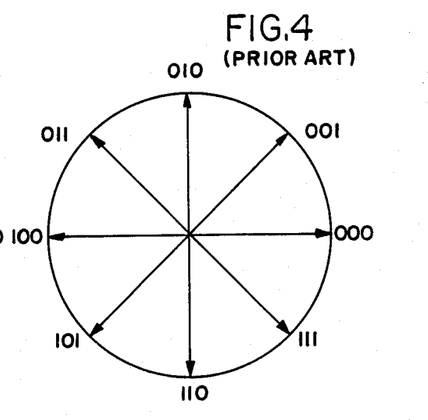
FIG. 4 is a phase diagram illustrating indexing of phase states for a set partitioning technique.

To illustrate, with reference to FIG. 4, consider the indexing of the 8 PSK modulations induced by set partitioning of the type taught by Ungerboeck. In accordance with the invention, a quaternary phase shift keying set with minimum squared Euclidean distance of 2 is formed by fixing the set of modulations formed by the last of the three bits at either 0 or at 1. Consequently any pair of modulations differing only by changes restricted to the two-dimensional subspace formed by the topmost, the most significant bit, and the center, the center significant bit, have a squared Euclidean distance separation of at least 2. Similarly, if the two rightmost indexing bits, the center and the least significant bit, are fixed at any one of the four possible values, the pair of modulations differing only in the most significant bit have a squared Euclidean distance separation of 4. (In the case of 8 PSK, this indexing of modulations is like that created by Imai and Hirakawa, using different notation.)

Figure 5:
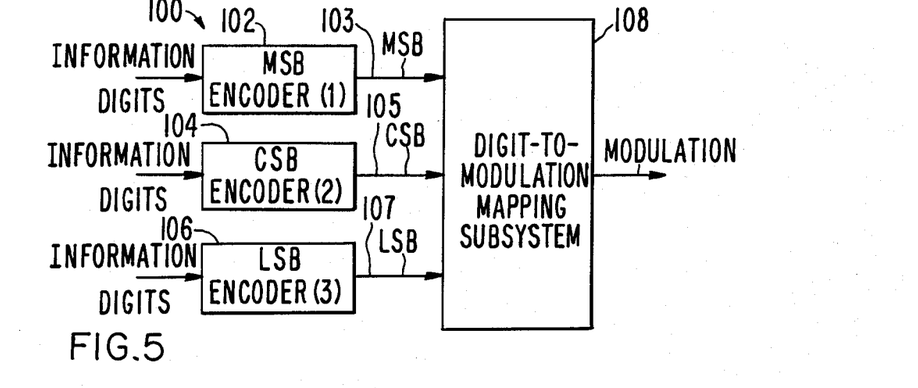
FIG. 5 is a block diagram of a general encoder/modulator structure in accordance with the invention.

FIG. 5 illustrates a basic encoder/modulator apparatus 100 according to the invention for exploiting the organization of the modulations described hereinabove. The encoder/modulator apparatus 100 comprises a first, or lsb, encoder 102, a second, or csb, encoder 104, a third, or msb, encoder 106 and a digit-to-modulation mapping subsystem 108 coupled to receive, respectively, the most significant bit (msb), the center significant bit (csb), and the least significant bit (lsb) from inputs of information digits. The lsb encoder 106 is of the form which generates a strong binary error-correcting code with minimum Hamming distance $D_3$. The lsb code is the strongest code and therefore has the most impact on decoding. A change in one information bit going into the lsb encoder 106 causes a number of bits at least equal to the value $D_3$ to be changed going into the mapping circuit (a conventional one-for-one table translation from a pure digit to a radial value signal, which in turn is applied to an analog signal modulator), which in turn leads to a squared Euclidean distance of at least $\delta_3{}^2 D_3$, no matter what changes occur in the information bits going into Encoders 1 and 2. If no changes occur in the information bits going into lsb encoder 106, then any change in the information bits going into csb encoder 104 must cause a number of bits equal to at least the value $D_2$ to be changed, which then leads to a squared Euclidean distance of at least $\delta_2{}^2 D_2$ no matter what changes occur in the information bits going into msb encoder 102. Finally, if no changes occur in the information fed into lsb or csb encoders 106 or 104, any change in the information bits going into msb encoder 102 must cause at least $D_1$ bits to be changed, which leads to a squared Euclidean distance of at least $\delta_1{}^2 D_1$. The minimum squared Euclidean distance separation of any pair of encoded modulations is thus at least:

$$D \geq \min_{1 \leq l \leq L} (\delta_l{}^2 D_l).$$

The method practiced by apparatus according to the invention differs significantly from the methods of the prior art. For example, unlike both Ungerboeck and Ginzburg, the modulations are organized by subspaces, rather than by the mathematically more general but practically less useful hierarchy of subsets. The subspaces create more highly disciplined indexing that can be exploited without further detailed knowledge of the structure of the particular modulations.

Similarly, while Imai and Hirakawa's construction lead to subspaces in the case of several particular types of modulations, the possibility of subspace organization was never recognized and thus no advantage has been suggested of the flexibility afforded by subspace organization.

Still further, while Sayegh's constructions (which include 8-AMPM and 16-QASK as well as PSK modulations) use the modulation indexings suggested by Ungerboeck, and Ungerboeck's labellings would induce one of many possible sequences of nested binary subspaces for the modulations described therein. Sayegh failed to recognize or suggest that any equivalent subspace organization is sufficient or that the subspaces need not be binary in general.

To understand the flexibility of the subspace organization, suppose that any arbitrary modulation can be indexed by subspaces of bits such that changes restricted to $s_1$ bits forming a Subspace 1 induce a squared Euclidean distance of at least $\delta_1{}^2$; changes restricted to the $s_1$ bits forming a Subspace 1 or the $s_2$ bits forming a Subspace 2 induce a squared Euclidean distance of at least $\delta_2{}^2$; changes restricted to the $s_1$ bits forming a Subspace 1 the $s_2$ bits forming a Subspace 2, or the $s_3$ bits forming a Subspace 3 induce a squared Euclidean distance of at least $\delta_3{}^2$; and so forth. We assume $\delta_1{}^2 > \delta_2{}^2 > \delta_3{}^2 > \ldots > \delta_L{}^2$. Typically such subspace indexings of the modulations can be created by using the groups and subgroups of invariances of the set of elementary modulations. In general the subspaces need not be over extension fields of the binary field: fields of characteristic other than 2 may be appropriate for other signal constellations. Typically, however, extension fields of the binary field are of the greatest practical importance, and we will focus attention primarily on such examples.

To perform the combined encoding and modulation, a first error-correcting encoder 102 for a code with minimum Hamming distance $D_1$, producing symbols consisting of $s_1$ bits, is used to produce the successive sets of $s_1$ bits to be fed into the most significant subspace lines 103 of the digit-to-modulation mapping subsystem 108. Similarly, a second error-correcting encoder 104 for a code with minimum Hamming distance $D_2$, producing symbols consisting of $s_2$ bits, is used to produce the successive sets of $s_2$ bits to be fed into the next most (center) significant subspace lines 105 of the digit-to-modulation mapping subsystem 108. This continues until at the bottom, an error-correcting encoder for a code with minimum Hamming distance $D_L$, producing symbols consisting of $s_L$ bits, is used to produce the successive sets of $s_L$ bits to be fed into the least significant subspace lines of the digit-to-modulation mapping subsystem 108. In practice, the $i^{th}$ encoder may be either a convolutional encoder or a block encoder digits in an extension field $GF(2^{s_i})$, or, more simply, $s_i$ copies of a binary error-correcting encoder for a code with minimum Hamming distance $D_i$ (although such copies are usually less efficient for the same level of protection). In cases where the Euclidean distance separations of the $i^{th}$ subspace mirror perfectly the Hamming distance separations of the digital code (as is the case for QPSK modulations), the $s_i$ digits for the $i^{th}$ subspace may be $i$ successive digits from an error-correcting code word.

With this subspace organization, by choosing the error-correcting codes to have minimum Hamming distances that vary roughly inversely with the squared Euclidean distance of subspaces, it is possible to create combined coding/modulations with very large channel distance separations at relatively high coding rate and without bandwidth expansion. Two examples of systems for more subtle modulations will serve to illustrate the signal creation method and distinguish the present invention from the more limited methods of Imai and Hirakawa and Sayegh.

Figure 6:
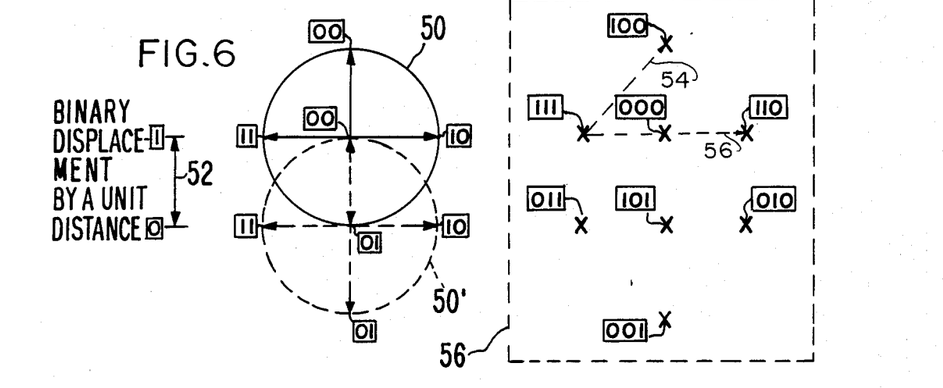
FIG. 6 is a constellation diagram illustrating indexing of an 8-AMPM signal in accordance with one embodiment of the encoder/modulation technique according to the invention.

FIG. 6 illustrates 8-AMPM modulation as two QPSK modulations 50 and 50, indexed as two subspaces which are combined with binary unit displacement 52. The resulting indexing 56 is illustrated in the adjacent portion of the figure. The X's correspond to the positions defined by the combined quadrature modulations. The corresponding index value is a three-digit binary number of an eye pattern. FIG. 6 thus shows how 8-AMPM modulation can be viewed as the combination of two "large grain" QPSK modulations each defined on respective two dimensional unit radius circles 50 and 50' shifted by a unit displacement 52 relative to each other.

A "small grain" binary subspace determines which of the two QPSK versions circumscribed by the unit radius circles 50 or 50' is sent. If the QPSK signal is indexed to be broken up into two subspaces, one with squared Euclidean distance of 2, e.g., between 111 and 100 (54) and the other with squared Euclidean distance 4, e.g., between 111 and 110 (56) as shown in the right side of FIG. 6, these can be used as the most significant bits of a three bit indexing of 8-AMPM. The least significant bit is the value of the binary unit displacement 52 and is the third bit (the left-most bit of each triplet in the Figure) which determines which of the two displaced QPSK versions 50 or 50' is sent. The result is a labeling identical to that of Ungerboeck as used by Sayegh.

Figure 7:
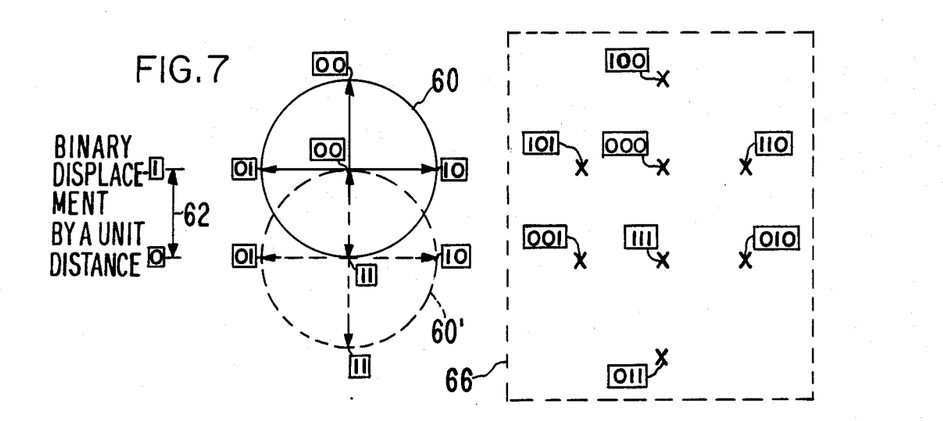
FIG. 7 is a constellation diagram illustrating indexing of an 8-AMPM signal in accordance with a second embodiment of the encoder/modulation technique according to the invention.

FIG. 7 shows another indexing scheme according to the invention. FIG. 7 illustrates 8-AMPM modulation as two Gray code signals constellations 60 and 60' indexed as two subspaces which are combined with binary unit displacement 62. The resulting indexing 66 is illustrated in the adjacent portion of the figure. The X's correspond to the positions defined by the combined quadrature modulations. The corresponding index value is a three-digit binary number of an eye pattern. FIG. 7 thus shows how 8-AMPM modulation can be viewed as large grain QPSK components indexed by a conventional Gray code to form two-dimensional subspaces in which the Hamming distance of a binary error correcting code is mirrored exactly by the squared Euclidean distance of the modulation combined by a binary unit of displacement. As before the choice of binary subspace (selected by binary unit displacement 62) determines which of the two versions 60 or 60' is transmitted. This indexing 66 is shown in FIG. 7, and it is obviously not equivalent to Ungerboeck's indexing (equivalent to 56 of FIG. 6). With this indexing 66, the two dimensional subspace 60 or 60' can be determined by two successive bits from a single binary error correcting code of minimum distance $D_1$. The third subspace bit can determined by another binary error-correcting code of minimum distance $D_2$. The squared Euclidean distance separation of any two signals created by the system is at least:

$$D \geq \min(2D_1, D_2).$$

Because longer error-correcting codes are more efficient than short ones for a given minimum distance, this construction in many instances gives more efficient signal sets than does Sayegh's construction and is therefore a notable advance.

The method of construction according to the invention suggests other alternatives. For example, a 16-QASK can be viewed as the combination of a large grain QPSK with a smaller grain QPSK set of displacements. Each of the QPSK signals can be indexed either as two separate subspaces or as a single two-dimensional subspace.

Figure 8:
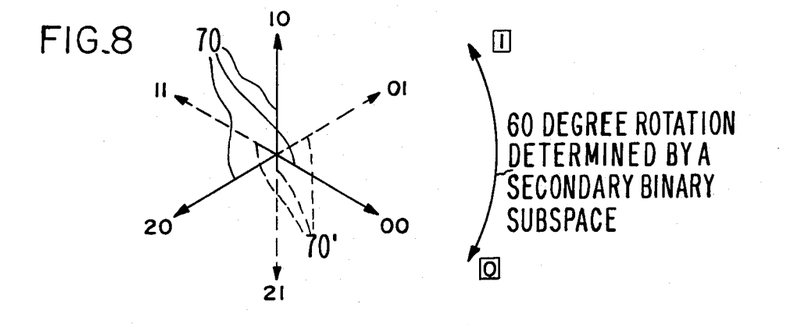
FIG. 8 is a phase diagram illustrating indexing of a 6-PSK signal in accordance with a further embodiment of the encoder/modulator according to the invention.

Further according to the invention, constructions based on nonbinary subspaces may also be implemented. With reference to FIG. 8, such a possibility will be illustrated by an unusual modulation, 6-PSK. In FIG. 8 6-PSK is shown with an indexing in which a single ternary digit from GF(3) (values 0,1 or 2) determines each 3-PSK modulation 70 or 70' and a single binary digit selects which of two possible 3-PSK modulations 70 or 70' is used. This leads to a sequence of subspaces consisting of two subspaces: the first is a GF(3) ternary subspace that selects a signal from a 3-PSK set and the second is a GF(2) binary subspace that selects which of two rotated versions of the 3-PSK signal will be used. Using simple trigonometry and assuming a unit radius circle, it can be determined that the squared Euclidean distance associated with the ternary subspace is 3 whereas that for the binary subspace is 1. Here the squared Euclidean distance separation of any two signals created by the system is at least $$D \geq \min(3D_1, D_2).$$

As a concrete instance, the first ternary subspace code could be a ternary Hamming (121,116,3) code while the binary subspace code could be (121,93,9) shortened BCH code. In 121 transmitted 6-PSK symbols $116(\log_2 3) + 93 = 183.85 + 93 = 276.85$ bits could be transmitted (as opposed to $2(121) = 242$ bits for QPSK) while achieving an asymptotic gain of $\log_{10}(9/2) = 6.53$ dB. over uncoded QPSK.

The encoding structure described above provides a natural parallelism that is convenient for high speed operation. However, using techniques considered state-of-the-art prior to the present invention, many of the signal sets created in this way could not be effectively decoded without the use of enormously complex decoding circuitry. A second advance of the present invention is to provide practical techniques for decoding the combined coding/modulation signal sets at high data rates and with very practical and cost-effective circuits.

Decoding Circuits and Methods

The present invention makes use of selected Tanner's algorithms as described in the 1981 Tanner article, the contents of which is incorporated herein by reference. In the present invention, the decoding/demodulation attempts to use all of the probability information provided by the channel for a sophisticated modulation scheme in an extremely simple fashion. For high-speed performance, the preferred embodiment breaks the decoding process into stages corresponding to the decoding of the digits by the same subspaces used in the encoding process.

The work of Imai and Hirakawa also serves as a point of departure for demodulation/decoding. In the preferred embodiment of the demodulator/decoder of the present invention, the methods and circuits of Imai and Hirakawa are improved in three ways. First, decomposition is organized by general subspaces in accordance with the invention and implemented in the encoder/modulator of the present invention, rather than by single bits as suggested for the limited set of modulations treated by Imai and Hirakawa. Subspace organization according to the invention permits the methods of the present invention to be adapted to virtually any modulation scheme.

Second, in the present invention, circuits suggested in Imai and Hirakawa are replaced by "extractors" which, at the $i^{th}$ stage, produce quantized logarithms of the likelihoods:

Pr($S = S_j$ | R received), for each distinct index $s_j$, where $S_j$ is the elementary modulation indexed by $s_j$ in the $i^{th}$ component; i.e., the most likely elementary modulation is indexed by $s_{i+1}, s_{i+2}, \ldots s_L$, which are the best estimates for the values of the digits of the more sensitive subspaces produced by the decoder in the previous decoding stages. In contrast, Imai and Hirakawa used the more complex calculation of a posteriori probabilities with "intermediate estimation circuits".

Third, and perhaps most importantly, one or more of the decoder circuits is a decoder implementing one of the graph-based decoding algorithms of the Tanner article [tan81]. In the preferred embodiment, Algorithm B of the Tanner article is used for the first time while supplied with quantized logarithms of probability ratios by the "extractor" of that stage. Hence, the Algorithm B is employed with "soft-decision" information.

Figure 9:
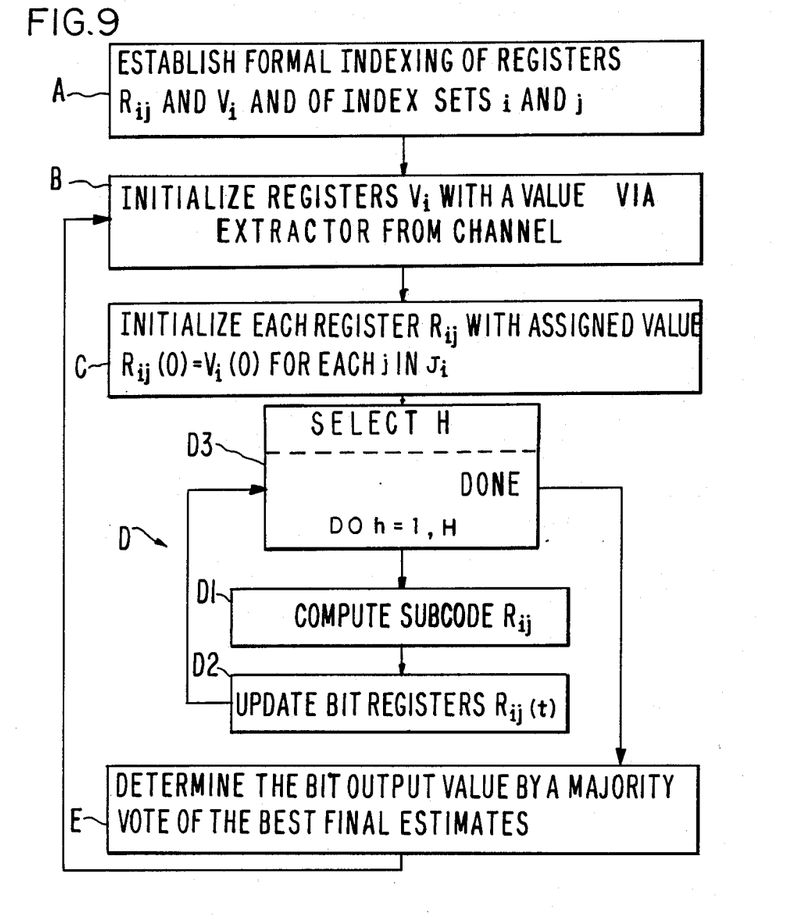
FIG. 9 is a flow chart of a generalized decoding-/demodulation method implemented in a preferred embodiment of a demodulator/decoder implemented in accordance with the invention.

Referring to the flow chart of FIG. 9, Algorithm B is as follows as adapted for decoding with soft decision information according to the present invention. (The algorithm is described with respect to decoding based on hard decision information on page 541 of the Tanner paper):

(1) Establish a formal indexing for the registers required (Step A): Let $R_{ij}$ be the register associated with bit i, where $i=1,2,\ldots,N$, which is accessed by subcode processor j, where $j=1,2,\ldots,S$. $R_{ij}(t)$ is the value stored by the register $R_{ij}$ after the $t^{th}$ iteration, and $R'_{ij}$ is a corresponding temporary storage register. Let $V_i$, where $i=1,2,\ldots,N$, be a register storing a value $V_i(0)$ which is of value $+1$ or $-1$ if the $i^{th}$ bit was received as a 1 (one) or a 0 (zero), respectively. Let $J_i$ be the index set of the subcode processors accessing bit i, and let $I_j$ be the index set of bits accessed by the subcode processor j.

(2) Initialize the registers required: Load each of the $V_i$ registers with a value provided by the corresponding extractor based on information provided by the channel for the $i^{th}$ bit (Step B). Assign register $R_{ij}(0)$ the value in register $V_i(0)$ for each register $R_{ij}$, for which j is an element of $J_i$ (Step C).

(3) Perform an iterative loop (Step D) comprising a subcode phase (Step D1) and a bit register phase (Step D2): In the subcode phase (Step D1), for each value t from 1 to f, where f is a number of iterations selected as a matter of engineering choice for accuracy and speed (the end of the loop is determined in Step D3), determine temporary value $R'_{ij}$ as follows:

$$R'_{ij} = \tfrac{1}{2}\left[\begin{array}{l} \max_{\substack{C \in \alpha \\ C_i = +1}} (1C \cdot R_j(t-1) - R_{ij}(t-1) - \\ \\ \max_{\substack{C \in \alpha \\ C_i = -1}} (C \cdot R_j(t-1) + R_{ij}(t-1)] \end{array}\right.$$

for each i which is a member of the set $I_j$, where $\alpha$ is the set of vectors derived from all words in the $j_{th}$ subcode, by replacing each one in a code word with a $+1$ and each zero in a code word with a $-1$;

$C = (C_{i1}, C_{i2}, \ldots, C_{in})$, each derived from a code word in the subcode by replacing each 1 in the code word by a $+1$ and each 0 by a $-1$;

$R_j(t-1)$ is the ordered vector of register values $[R_{i_1j}(t-1), R_{i_2j}(t-1), \ldots, R_{i_nj}(t-1)]$ with $i_1, i_2, \ldots, i_n$ in a member of the set $I_j$; and $C \cdot R_j$ denotes a real vector inner product. If g/2 is odd, and $t=1$, then all $R_{ij}$ values are divided by m, the degree of bit nodes in the graph defining the code (in order to avoid multiply counting bits at the bottom of the tree).

In the bit register phase (Step D2), for each $i=1,2,\ldots,N$, the registers for the $i^{th}$ bit are updated as follows:

$$R_{ij}(t) = \sum_{l \in J_i} R'_{il} - R'_{ij} + V_i(0)$$

(3) Make a final decision for the value of the bit (Step E): Using the $j^{th}$ subcode processor, find the vector for C which achieves the maximum value for the real vector inner product of the last iteration in the loop and store the corresponding component of the maximizing subcode word in the corresponding temporary storage register. That is, find: max $[C \cdot R_j(f)]$, where f is the floor function of $C \in \alpha$ $(g-2)/4$, and set $R'_{i1j} = C_{i1}$.

This will result in the output value of the $i^{th}$ bit being one if the sum of all $R'_{ij}$, where j is a member of the set $J_i$, is greater than zero, and zero if otherwise. In other words, the final value of the $i^{th}$ bit is determined by a majority vote of the best final estimates provided by the subcodes checking the $i^{th}$ bit, (Note the difference between the index value 1 and the index variable l.) Alternatively, the number of iterations may be preselected according to an engineering preference for precision and speed. A suitable number of iterations for a code of less than length 500 is three.

Figure 13:
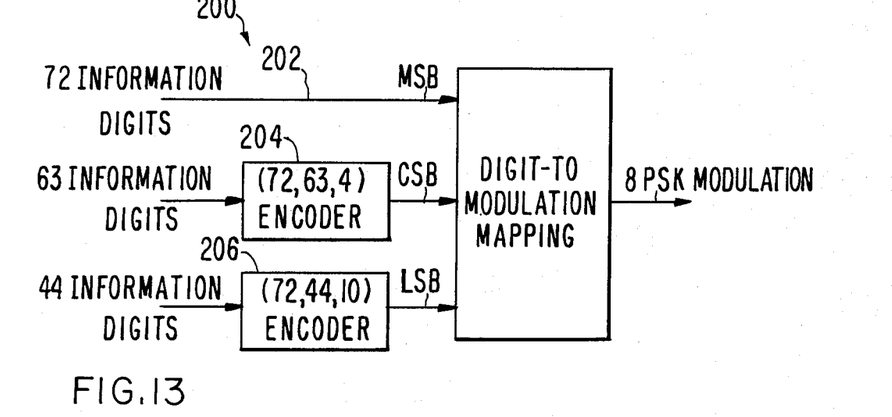
FIG. 13 is a block diagram of an encoder/modulator structure in accordance with a preferred embodiment of the invention.

A specific decoder implementing Algorithm B is described in connection with FIG. 13. FIG. 13 is described hereinbelow.

Figure 10:
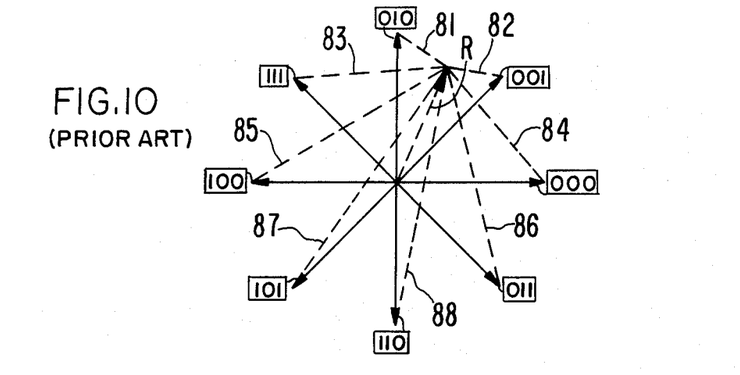
FIG. 10 is a phase diagram illustrating extraction and demodulation of a signal of a prior art decoding and demodulation method.

The second distinction above will be more easily understood by considering the process of producing estimates for the values of the digits of the $i^{th}$ subspace starting from the most sensitive $L^{th}$ subspace in the simple case where each subspace is binary. For example, consider the 8-PSK modulation of FIG. 4. Referring now to FIG. 10, using Imai and Hirakawa's method, if vector R is received, to calculate the a posteriori probabilities $Pr(s_3=0 \mid R$ received$)$ and $Pr(s_3=1 \mid R$ received$)$, ($\mid R$ received means "given R is received") all of the eight distances 81–88 from R to each of the elementary modulations 010,001,111,000,100,011,101,110 shown in FIG. 10 must be used.

Figure 11:
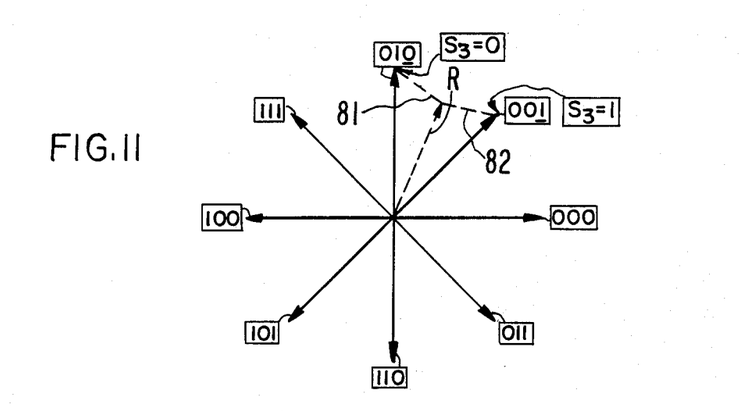
FIG. 11 is a phase diagram illustrating extraction and demodulation of a signal according to one embodiment of the present invention.

In the extraction method according to the present invention, (FIG. 11) only the two elementary distances, 81, with modulation $s_3=0$, and distance 82, with modulation $s_3=1$, are used, assuming that the channel noise density function is a monotonically decreasing function of distance. If the channel noise density function is a monotonically decreasing function of distance, as is the case for white Gaussian noise, the two indicated distances 81 and 82 will be the shortest distances to the two most likely elementary modulations $s_3=0$ and $s_3=1$, respectively. For relatively high signal-to-noise ratios, the a posteriori probabilities associated with the distances 81 and 82 are dominant in the calculation of the true a posteriori probabilities, and the probability calculation is greatly simplified by the use of these two alone.

Figure 12:
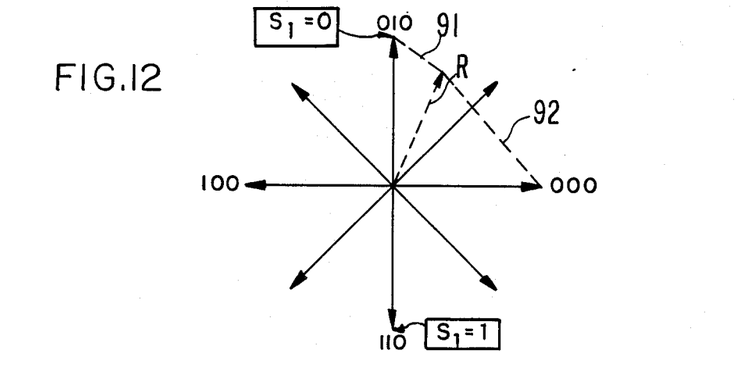
FIG. 12 is a phase diagram illustrating extraction and demodulation of a signal according to a further embodiment of the present invention.
Figure 14:
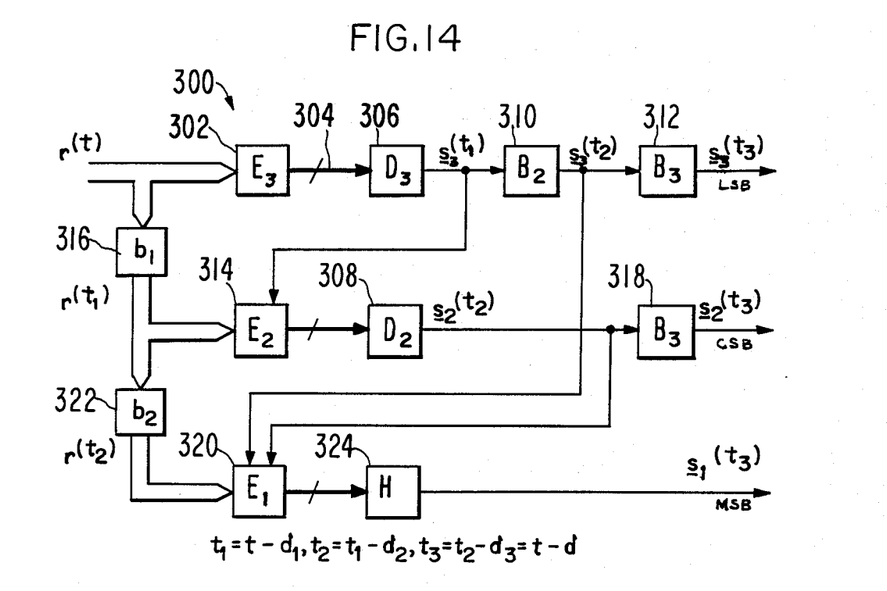
FIG. 14 is a block diagram of a demodulator/decoder in accordance with a preferred embodiment of the invention.

Consider an example with reference to FIG. 12 and FIG. 14 of 8 PSK modulations. (The full structure of a demodulator/decoder is described hereinafter). The decoder (306) for the least significant bit is operative to decide that for example the best estimate for $s_3$, $S_3$, is 0. An extractor (FIG. 14 314) according to the present invention at the next stage is operative to calculate the logarithm of the likelihood ratio of only the two most likely elementary modulations. (Imai and Hirakawa transpose most significant bit and least significant bit designations. In Imai and Hirakawa's method, at the next stage the probability computation would have to use the probabilities associated with four distances rather than only two distances 91 and 92.) The extractor may be specific for the type of noise expected in the channel. For this purpose, the extractor may be a simple read-only memory circuit which produces a defined precomputed output in response to an input based on a limited number of possible inputs. The results are used as the soft decision information for a decoder (FIG. 14. 308) which produces a best estimate for $s_2=s_2$. In the case of 8 PSK modulations, the estimates $s_2$ and $s_3$ are used by the third extractor (320) that provides log-likelihood ratios for the decoder (324) determining the best estimate for $s_1$, $s_1$. Since $s_2$ and $s_3$ are specified (for example $s_2=1$ and $s_3=0$), there are only two elementary modulations possible $s_1=0$ and $s_1=1$, as shown in FIG. 12, so the third extractor (320) for the last stage is operative to calculate the same log-likelihood ratio as would Imai and Hirakawa's circuit, except much more efficiently.

It can be appreciated that for complicated multilevel and multiphase modulations, the use of only the most likely elementary modulations represents a substantial simplification of the calculation required by the known prior art.

The third advance is the use of decoders based on specific algorithms, and most specifically Tanner's Algorithm B above. In the preferred embodiment, the most powerful error-correcting code is applied to the digits governing the most sensitive index subspace of the modulation. The graph-based algorithms of Tanner, particularly Algorithm B perform decoding as multiple iterations of replicated simple primitive operations that can be performed in parallel. As a result they can be implemented in large scale integrated circuits which can handle extraordinarily high data rates and decode highly efficient codes with soft decision information using a relatively small number of integrated circuits. This property makes the algorithms an excellent choice for the error-correcting decoders of the present invention, particularly for the most powerful error-correcting code in high performance systems.

FIG. 13 illustrates a preferred embodiment of an encoder/modulator 200 according to the present invention for the particular case of 8 PSK modulation on a white Gaussian noise channel at an operating signal-to-noise ratio $E_s/N_o$ of approximately 13.5 dB (output bit error rate of approximately $5 \times 10^{-7}$) (compare FIG. 5). FIG. 14 illustrates a preferred embodiment of a demodulator/decoder 300 according to the present invention for the same type of encoding and modulation. While the encoder/modulator and demodulator/decoder shown here are compatible, there is nothing that precludes the use of an encoder/modulator of a different design with the demodulator/decoder of the invention or the use of a demodulator/decoder of a different kind with an encoder/modulator according to the invention so long as the signal information is in a recognized modulation format.

Referring to FIG. 13 the strongest code, for the least significant bit or third incremental subspace of the 8 PSK indexing, is a length 73 perfect difference set code with 45 information bits and minimum distance 10 defined by a 73 by 73 circulant parity check matrix with 10 ones per column and 10 ones per row. The code is shortened by one bit to (72,44,10) by setting one of the information bits to 0 (encoder 206). The code for center significant bit is a [72,63,4] shortened Hamming code formed by using 72 of the weight three columns of the parity check matrix of a length 511 Hamming code as the parity check matrix (encoder 204). The code for the most significant bit is a trivial (72,72,1) code: that is, the information is uncoded (line 202). The encoder thus has the form shown in FIG. 5 and is coupled to a digit-to-modulation mapping subsystem 108 whereby 8-PSK modulation is applied to an information channel in the conventional manner. (If the order of bit significance is reversed, the form of the encoder is readily compared with the ordering of subspaces and presentation of Imai and Hirakawa.)

The structure of the demodulator/decoder system 300 according to the invention is shown in FIG. 14. The input is a signal represented by the time-related function $r^{(t)}$, which is an analog input signal or an equivalent digital signal representative of the information and noise in the communication channel (for example, a sampled data stream of discrete digital values which have a one-for-one correspondence with the analog time-domain signal at the terminal of the communication channel). The demodulator/decoder subsystem 300 produces as an output the estimated digital subspace vector values $s_1^{(t3)}, s_2^{(t3)}$, and $s_3^{(t3)}$, which represent the distinct $s_i$ values delayed by "d" time units. Specific time delays are as follows: $t_1 = t - d_1$; $t_2 = t_1 - d_2$; $t_3 = t_2 - d_3 = t - d$: where $d_i$ represents the delay of decoding in accordance with the order of processing for a received vector. Several extraction circuits are employed which are operative to calculate log-likelihood values as described hereinabove or as elsewhere in the art (for example, in Imai and Hirakawa).

The demodulator/decoder subsystem 300 comprises a first intermediate extraction circuit $E_1$ 302 coupled to receive an analog signal or equivalent bit stream $r^{(t)}$ and to apply a first extracted output signal 304 to a first algorithm-specific decoder $D_1$ 306. A second algorithm-specific decoder 308 is also provided. The first and second algorithm-specific decoders 306 and 308 implement the Tanner Algorithm B (FIG. 9) and comprise a plurality of fixed registers and working registers (not shown) as needed to execute the algorithm. The algorithm may be implemented in connection with a digital computer processing system of a standard design or of a design especially suited to digital signal processing applications. One application has been described in the Chethik et al. paper incorporated herein by reference.

The output of the first algorithm-specific decoder is a binary digital value $s_1^{(t1)}$ coupled to a first time buffer 310, the output of which is a binary digital value $s_1^{(t2)}$ supplied to a second time buffer 312, the output of which is the desired estimate value of $s_1$ for the time slot or frame $t_3$.

The output of the first algorithm-specific decoder 306 is also coupled to a second intermediate extraction circuit 314 to which is also coupled an analog or equivalent input signal $r^{(t1)}$, which is the input signal r delayed by $d_1$ time unit via a first input time buffer $b_1$ 316. The second intermediate extraction circuit $E_2$ 314 processes the delayed signal or equivalent bit stream $r^{(t1)}$ in view of the estimate $s_1^{(t1)}$ and applies a result in nonbinary form to the second algorithm-specific decoder $D_2$ 308. The output of the second algorithm-specific decoder $D_2$ 308 is the estimate $s_2^{(t2)}$, which in turn is coupled to be applied to a third time buffer $B_3$ 318 and to a third intermediate extraction circuit $E_3$ 320. The output of the third time buffer $B_3$ 318 is the desired output estimate $s_2^{(t3)}$.

The output of the second algorithm-specific decoder 308 and the output of the first algorithm-specific decoder 306 are also coupled to the third intermediate extraction circuit 314 to which is also coupled an analog or equivalent (delayed) input signal $r^{(t2)}$, which is the input signal r delayed by $d_1+d_2$ time units via the first input time buffer $b_1$ 316 and a second input time buffer $b_2$ 322. The third intermediate extraction circuit $E_3$ 320 processes the delayed signal or equivalent bit stream $r^{(t3)}$ in view of the estimates $s_1^{(t1)}$ and $s_2^{(t2)}$ and applies the result in nonbinary form to a hard decision decoder H 324 for the most significant bit. The output of the hard decision decoder H 324 is the desired output estimate $s_3^{(t3)}$.

The decoder system 300 operates as follows: The Algorithm B decoder 300 for the least significant bit ($D_1$ 306) loads its fixed registers and working registers (not shown) for each bit with log-likelihood ratio for that bit provided by the extractor ($E_1$ 302), each log-likelihood represented by a 6-bit quantity in the exemplary implementation. The two-phase correction process of Algorithm B (according to the flow chart of FIG. 9) is repeated for example three times before a best estimate for each bit is produced. The best estimates are fed to the extractor for the next stage. The quantized log-likelihood values provided by the extractor for the second stage are fed into the second Algorithm B decoder $D_2$ 308 for the shortened Hamming code. The decoder 308 is structured on a graph for the code in which every bit is checked by exactly three of the nine parities. The resultant two estimates produced $s_1$ and $s_2$ are fed to the third extractor $E_3$ 320 for the most significant bit stage. At this operating point, no coding is required on the most significant bit inasmuch as the probability of error of binary PSK is lower than the error rate for the estimates produced by the (72,44,10) decoder. Consequently, the extractor 320 output is hard limited by the hard decision decoder 324 to produce a hard decision for the most significant bit. The output of the hard decision decoder H 324 is thus the desired output estimate $s_3^{(t3)}$, which together with the other values $s_1$ and $s_2$ represent the best estimate of the information transmitted from the remote data source.

Simulation studies of this particular preferred embodiment have been conducted. The system achieved better than 6 dB of coding gain over uncoded 8 PSK with a Gray code mapping of information to modulations at an uncoded bit error rate of $5\times 10^{-7}$. The overall coding rate for the system was $(44+63+72)/(3\times 72)=82.8\%$. This compares very favorably with any other system proposed or implemented. At the finite bit error rate operating point of the present system and with actual implementation losses, a trellis code will achieve less than its asymptotic gain.

The preferred implementation discussed is only illustrative of the many forms that combined coding and modulation systems realizing the advances of the present invention can assume. For example, it should be understood that the application of the invention to nonbinary subspaces includes multidimensional subspaces and the term binary subspace as used herein applies to one-dimensional binary subspaces. It is therefore not intended that this invention be limited except as indicated by the appended claims.

I claim:

1. In a digital signal communication system for communicating information through an information channel, a method for combined coding and modulation of digital information comprising the steps of:
   indexing digital signals representative of elementary modulations by indexing vectors to create a decomposition of indexing vectors of an index vector space into a plurality of ordered subspaces, including binary and nonbinary subspaces;
   associating with each said indexing vector a Euclidean distance in modulation space such that any two modulations whose indexing vectors differ only by a distance vector contained in a first subspace and any preceding (higher significant) subspaces of the series of ordered subspaces are separated in said modulation space by at least said Euclidean distance; and
   encoding information signals by encoders employing error-correcting codes, each said encoder producing a symbol representative of an indexing vector of the same dimension as a corresponding one of said ordered subspaces for communication of said symbol through said information channel.

2. A method according to claim 1 wherein said error-correcting codes are finite length block codes.

3. A method according to claim 1 wherein said error-correcting codes are continuous overlapping convolutional codes.

4. A method of encoding the modulated signals according to claim 1 wherein said encoders encode concurrently to produce redundant indexing vectors, further including the step of providing said redundant indexing vectors to a modulator mapping subsystem concurrently along parallel data paths.

5. In a digital signal communication system for communicating information through an information channel, an apparatus for combined coding and modulation of digital information comprising:
   means for indexing digital signals representative of elementary modulations by indexing vectors to create a decomposition of indexing vectors of an index vector space into a plurality of ordered subspaces, including binary and nonbinary subspaces;
   means coupled to said indexing means for associating with each said indexing vector a Euclidean distance in modulation space such that any two modulations whose indexing vectors differ only by a distance vector contained in a first subspace and any preceding (higher significant) subspaces of the series of ordered subspaces are separated in said modulation space by at least said Euclidean distance; and
   encoding means coupled to said associating means employing error-correcting codes, each said encoding means for producing a symbol representative of an indexing vector of the same dimension as a corresponding one of said ordered subspaces for communication of said symbol through said information channel.

6. An apparatus according to claim 5 wherein said error-correcting codes are finite length block codes.

7. An apparatus according to claim 5 wherein said error-correcting codes are continuous overlapping convolutional codes.

8. An apparatus according to claim 5 wherein said encoding means encode concurrently to produce redundant indexing vectors and further including a modulator mapping subsystem coupled to said encoding means, said modulator mapping subsystem for receiving said redundant indexing vectors concurrently along parallel data paths.

9. An apparatus for encoding and modulating digital information to be transmitted as a signal in an information channel comprising:
- a first encoder;
- at least a second encoder; and
- a digit-to-modulation mapping subsystem coupled to receive encoded information digits from respective outputs of said first encoder and said at least second encoder;
- wherein said first encoder generates a strong error-correcting code from a set of possible codes including nonbinary codes, with minimum Hamming distance between encoded information digits such that a change in one information digits applied to said first encoder causes a number of digits at least equal to the value of said minimum Hamming distance to be changed for application to said mapping subsystem, with a squared Euclidean distance of at least $\delta^2 D$, where $\delta$ is the Euclidean distance and $D$ is the Hamming distance, independent of any changes which occur in the information digits applied to said at least second encoder.

10. A combined decoding/demodulation apparatus for recovering digital information in the form of indexing vectors in ordered subspaces from an information channel comprising:
- means for receiving noise and modulations through the information channel, said receiving means being suited to reception of modulations introduced into said information channel including more than pure phase shift keying and pure multilevel signaling;
- means coupled to said receiving means for estimating transmitted information from the received signal, said estimating means including successive stages of circuitry for extracting information pertaining to probability for a value of an indexing vector of a last subspace in a series of ordered subspaces not yet estimated as a function of estimated values of indexing vectors in all previously decoded subspaces; and
- means coupled to said estimating means for decoding the value of said modulations as an indexing vector value for an error-correcting code associated with each successive subspace thereby to produce estimates for each indexing vector through a last indexing vector of a last subspace.

11. An apparatus to claim 10, including one of said decoding means for each said subspace, wherein at least one of said decoding means includes means for computing a plurality of subcodes and means for selecting from said plurality of subcodes a best estimate of a digit value for a received modulation.

12. An apparatus according to claim 11 wherein one of the decoding means comprises a Tanner Algorithm B decoder employing soft decision information.

13. An apparatus according to claim 10, including one of said decoding means for each subspace, wherein said extraction circuitry comprises means for producing decoder input information as a function only of a posteriori probabilities for each most likely elementary modulation indexed by each possible indexing vector for its associated subspace in order and also indexed by estimated vectors produced by said decoding means for each preceding ordered subspace.

14. In a digital signal communication system for communicating information through an information channel, a method for combined decoding/demodulation to recover digital information in the form of indexing vectors in ordered subspaces from said information channel, said method comprising the steps of:
- receiving noise and modulations through said information channel, said modulations introduced into said information channel as a modulation value including more than pure phase shift keying and pure multilevel signaling;
- estimating transmitted information from the received signal in successive stages for extracting information pertaining to probability for a value of the indexing vector of a last subspace in a series of said ordered subspaces not yet estimated as a function of estimated values of the indexing vectors in all previously decoded subspaces; and
- decoding said modulation value as an indexing vector value for an error-correcting code associated with each successive subspace thereby to produce estimates for each indexing vector through a last indexing vector of a last subspace.

15. A method according to claim 14 further including the step of computing a plurality of subcodes and selecting from said plurality of subcodes a best estimate of a digit value.

16. A method according to claim 15 wherein the decoding step includes applying a Tanner Algorithm B decoding method with soft decision information to at least one said indexing vector estimate.

17. A method according to claim 14, including one of said decoding means for each subspace, wherein said extracting step includes producing decoder input information as a function only of a posteriori probabilities for each most likely elementary modulation indexed by each possible indexing vector for its associated subspace in order and also indexed by estimated vectors produced by said decoding means for each preceding ordered subspace.

18. A combined decoding/demodulation apparatus for recovering digital information in the form of indexing vectors in ordered subspaces from an information channel comprising:
- means for receiving noise and modulations through the information channel, said receiving means being suited to reception of modulations introduced into said information channel;
- means coupled to said receiving means for estimating transmitted information from the received signal, said estimating means including successive stages of circuitry for extracting information pertaining to probability for a value of an indexing vector of a last subspace in a series of ordered subspaces not yet estimated as a function of estimated values of indexing vectors in all previously decoded subspaces; and
- means coupled to said estimating means for decoding the value of said modulations as an indexing with each successive subspace including one of said decoding means for each said subspace wherein one of said decoding means comprises a Tanner Algorithm B decoder employing soft decision information thereby to produce estimates for each indexing vector through a last indexing vector of a last subspace.

19. In a digital signal communication system for communicating information through an information channel, a method for combined decoding/demodulation to recover digital information in the form of indexing vectors in ordered subspaces from said information channel, said method comprising the steps of:

receiving noise and modulations through said information channel, said modulations introduced into said information channel as a modulation value;

estimating transmitted information from the received signal in successive stages for extracting information pertaining to probability for a value of the indexing vector of a last subspace in a series of said ordered subspaces not yet estimated as a function of estimated values of the indexing vectors in all previously decoded subspaces; and decoding said modulation value as an indexing vector value for an error-correcting code associated with each successive subspace wherein the decoding step includes applying a Tanner Algorithm B decoding method with soft decision information to at least one said indexing vector estimate thereby to produce estimates for each indexing vector through a last indexing vector of a last subspace.

20. A method according to claim 19, wherein said extraction step includes producing decoder input information which is a function only of a posteriori probabilities for each most likely elementary modulation indexed by each possible indexing vector for its associated ordered subspace and also indexed by estimated vectors produced by the decoders for each preceding ordered subspace.

* * * * *